(12) United States Patent
Misawa

(10) Patent No.: US 7,446,356 B2
(45) Date of Patent: Nov. 4, 2008

(54) SOLID STATE IMAGING DEVICE

(75) Inventor: Takeshi Misawa, Saitama (JP)

(73) Assignee: Fujifilm Corporation, Tokyo (JP)

( * ) Notice: Subject to any disclaimer, the term of this patent is extended or adjusted under 35 U.S.C. 154(b) by 40 days.

(21) Appl. No.: 11/493,764

(22) Filed: Jul. 27, 2006

(65) Prior Publication Data
US 2007/0040194 A1 Feb. 22, 2007

(30) Foreign Application Priority Data
Aug. 17, 2005 (JP) .............................. 2005-236315

(51) Int. Cl.
H01L 31/062 (2006.01)
(52) U.S. Cl. ........................ 257/291; 257/292; 257/294; 257/E27.133
(58) Field of Classification Search .......... 257/E27.131, 257/291, 292, 294, 443, E31.122, E27.133, 257/233
See application file for complete search history.

(56) References Cited

U.S. PATENT DOCUMENTS 6,018,169 A * 1/2000 Tohyama ..................... 257/222
6,506,497 B1 * 1/2003 Kennedy et al. ............ 428/447
2003/0124763 A1 * 7/2003 Fan et al. ...................... 438/70
2006/0062899 A1 * 3/2006 Rankin et al. ................. 427/58
2006/0072215 A1 * 4/2006 Nishi .......................... 359/708
2006/0166395 A1 * 7/2006 Layman et al. ............... 438/60

FOREIGN PATENT DOCUMENTS

JP 60-010883 * 1/1985
JP 04-014257 * 1/1992
JP 10-135433 A 5/1998

OTHER PUBLICATIONS

[http://www.vbl.kobe-u.ac.jp/topics.html], Polymer fine particle with plural holes on the surface, Apr. 23, 2005.

* cited by examiner

Primary Examiner—Minh-Loan T Tran
(74) Attorney, Agent, or Firm—Birch, Stewart, Kolasch & Birch, LLP

(57) ABSTRACT

A CCD image sensor includes photodiodes, vertical transfer CCDs for transferal of signal charge of the photodiodes, and a light shielding layer for protection of the vertical transfer CCDs from light. The light shielding layer covers over recesses disposed above the photodiodes, and each of the recesses has an opening on the bottom to expose a light receiving surface of the photodiode. A light diffusion layer is formed on the light shielding layer in each recess. Since the incident light oblique to an optical axis of a microlens is diffused by the light diffusion layer, the vertical CCDs hardly receive the light coming from around the edges of the opening.

8 Claims, 5 Drawing Sheets

US 7,446,356 B2

SOLID STATE IMAGING DEVICE

FIELD OF THE INVENTION

The present invention relates to solid state imaging devices such as CCD image sensors, and more particularly to solid state imaging devices capable of preventing optical noises.

BACKGROUND OF THE INVENTION

In solid state imaging devices such as CCD image sensors, an optical noise called smear is sometimes produced. The smear is induced by unwanted electric charge in a vertical CCD, and such unwanted electric charge arises from intense light which enters the solid state imaging device at an oblique angle. As shown in FIG. 5, the incident light at an oblique angle from an optical axis L of a microlens 33 is reflected on a recess of a light shielding layer 27. The reflected light goes under the light shielding layer 27 from an opening 27a of the light shielding layer 27 to penetrate an insulation layer 25, and finally encounters a vertical CCD 13. This incident light to the vertical CCD 13 undergoes the photoelectric conversion, and produces the unwanted electric charge.

As a countermeasure to such disadvantage, Japanese patent laid-open publication No. 10-135433 discloses a solid state imaging device which has an jagged interface between the light shielding layer 27 and the insulation layer 25. Reflecting diffusely on the jagged interface, the incident light that goes under the light shielding layer 27 hardly enters the vertical CCD 13, and the smear is therefore reduced.

However, this solid state imaging device does not aim to prevent the incoming of the light under the light shielding layer, and is still not an adequate countermeasure.

SUMMARY OF THE INVENTION

In view of the foregoing, an object of the present invention is to provide a solid state imaging device which effectively reduces noises caused by oblique incident light.

In order to achieve the above and other objects, the solid state imaging device according to the present invention has a light diffusion layer or a light absorbing layer formed on a light shielding layer in each of recesses above photodiodes.

Disposed beside the photodiodes are transfer electrodes for transferal of electric charge stored in the photodiodes. These transfer electrodes are formed on a semiconductor substrate which has the photodiodes. The transfer electrodes and the photodiodes are both covered by a transparent insulating layer, on which the light shielding layer is formed. Each of the recesses is formed above one of the photodiodes such that the transfer electrodes surround the both sides of the photodiodes.

The light diffusion layer and the light absorbing layer are both made of a base material and inorganic fine particles or organic fine particles mixed thereto. It is preferable that the base material is either BPSG (boro-phospho silicate glass) or P-TEOS (plasma tetra ethyl ortho silicate). For the light diffusion layer, the inorganic fine particle is preferably $Al_2O_3$ or $TiO_2$, while the organic fine particle is preferably a polymer fine particle with plural holes on its surface.

For the light absorbing layer, the inorganic fine particle is preferably ferric oxide, or a barium sulfate with iron oxide coating, while the organic fine particle is preferably a carbon fine particle or nano-carbon fine particle.

According to the solid state imaging device of the present invention, the light diffusion layer or the light absorbing layer is formed in the recesses to diffuse or absorb the incident light oblique to the optical axis of the optical lens. Therefore, the optical noise is reduced effectively.

In addition, the light diffusion layer or the light absorbing layer is disposed outside the optical path of the incident light substantially parallel to the optical axis of the optical lens, and therefore light receiving efficiency is not decreased.

BRIEF DESCRIPTION OF THE DRAWINGS

The above objects and advantages of the present invention will become more apparent from the following detailed description when read in connection with the accompanying drawings, in which.

DETAILED DESCRIPTION OF THE PREFERRED EMBODIMENTS

Figure 1:
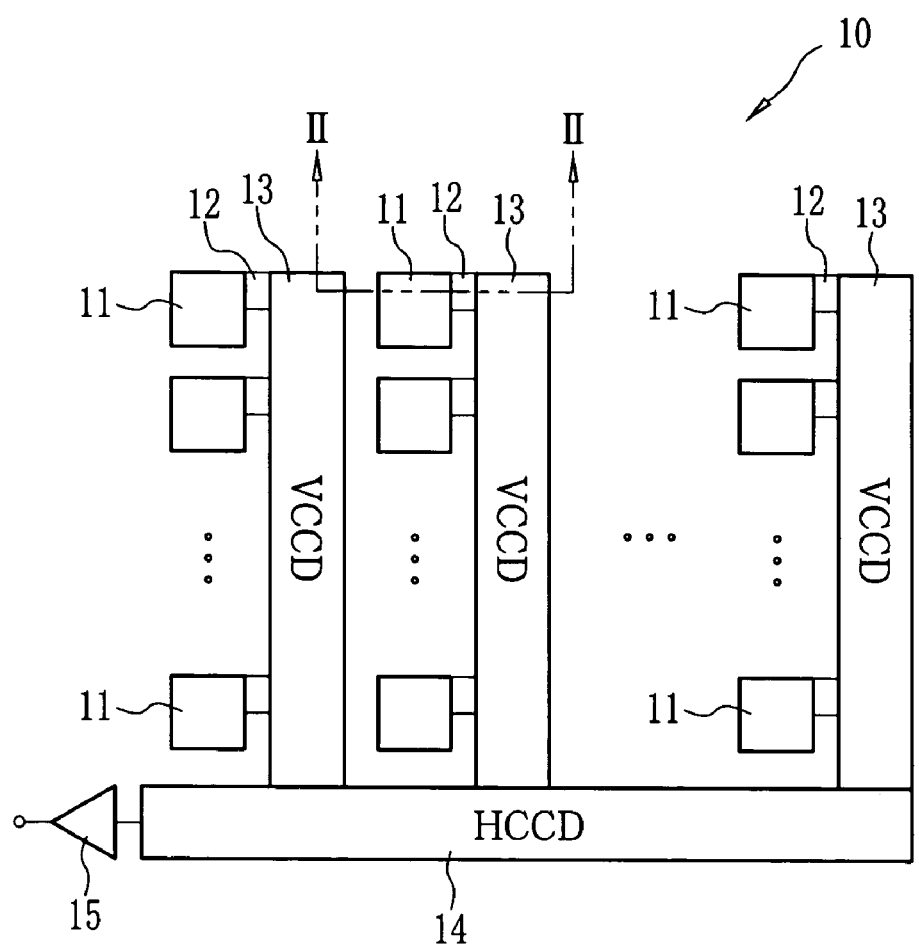
FIG. 1 is a explanatory plan view showing a configuration of a CCD image sensor according to the present invention.

As shown in FIG. 1, a CCD image sensor 10 has a plurality of photodiodes 11 in a two-dimensional matrix arrangement, readout transfer gates 12 provided for each of the photodiodes 11, vertical CCDs 13 provided for each column of the photodiodes 11, a horizontal CCD 14 connected to a terminal end of every vertical CCD 13, and an output amplifier 15 connected to a terminal end of the horizontal CCD 14.

Each photodiode 11 photoelectrically converts incident light into signal charge and stores it. After the exposure time is passed, the readout transfer gates 12 turn into an open state to allow the signal charge stored in the photodiodes 11 to move to the vertical CCDs 13. The vertical CCDs 13 send the signal charge, coming from the photodiodes 11 through the readout transfer gates 12, to the horizontal CCD 14 in a stepwise manner. The horizontal CCD 14 receives the signal charge from the vertical CCDs 13 step by step sequentially, and sends it in a horizontal direction toward the output amplifier 15. The output amplifier 15 amplifies and outputs the signal charge sent from the horizontal CCD 14.

Figure 2:
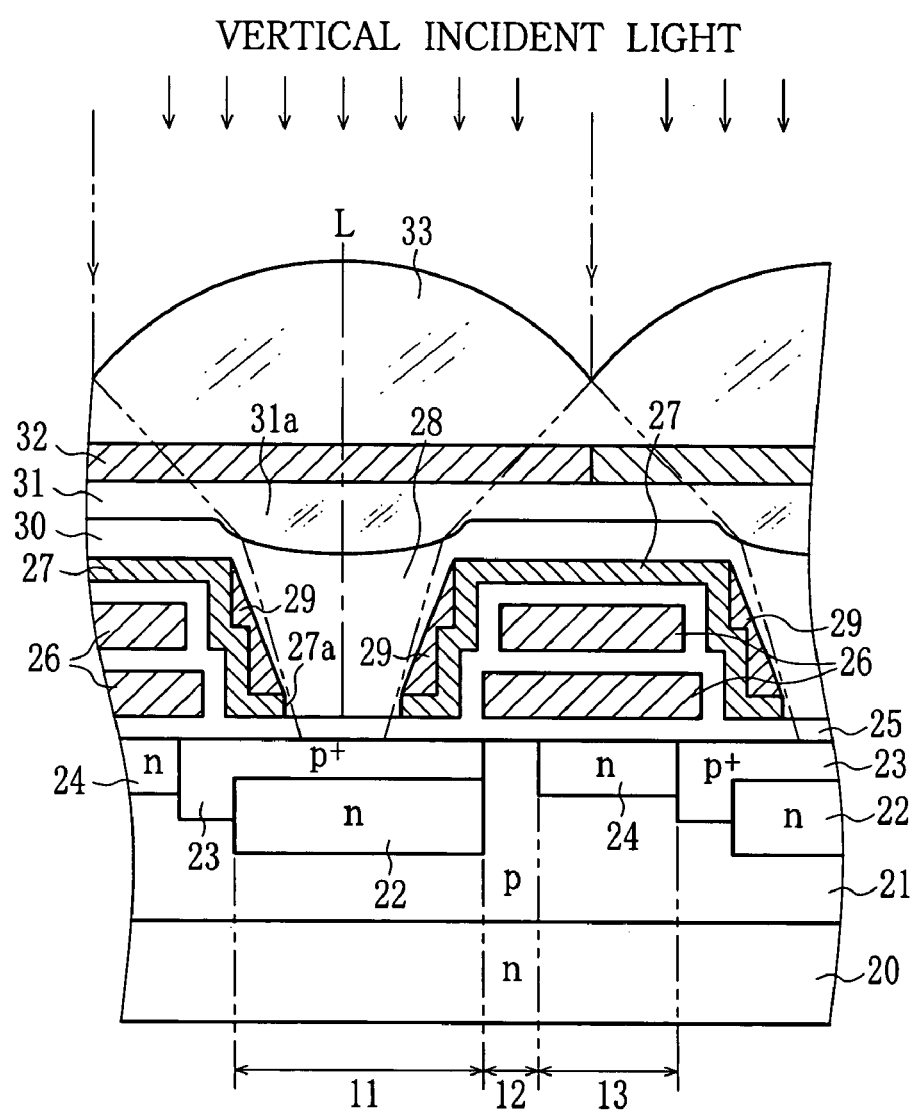
FIG. 2 is a cross sectional view along a II-II line in FIG. 1.

In FIG. 2, a P type well layer 21 is formed on an N type semiconductor substrate 20. Formed in the P type well layer 21 are N type layers 22 that store electrons as the signal charge. Formed on the N type layers 22 are $P^+$ type layers 23 that store electron holes. Namely, the photodiode 11 is a so-called embedded photodiode, configured of the p-n-p-n junction including the N type semiconductor substrate 20.

Additionally, formed at an upper portion of the P type well layer 21 are N type layers 24 that function as the vertical CCDs 13. The N type layers 24 are separated from the N type layers 22 by the P type well layer 21 and the $P^+$ type layers 23. The P type well layer 21 between the N type layers 22 and 24 functions as the readout transfer gate 12. Above the vertical CCD 13 (N type layer 24) and the readout transfer gate 12 (P type well layer 21 between the N type layers 22 and 24), transfer electrodes 26 are provided across a transparent insulating layer 25. The transfer electrodes 26 control the readout transfer gate 12 and the vertical CCD 13 for transferal of the signal charge. The insulating layer 25 is made of $SiO_2$ or the like, and covers the surface of the semiconductor substrate. The transfer electrodes 26 may be made of polysilicone or aluminum.

On the insulating layer 25 that encloses the transfer electrodes 26, a light shielding layer 27 of tungsten, aluminum, or the like is formed such that it only exposes a light receiving surface of each photodiode 11. Concretely, the light shielding layer 27 has recesses 28 for every photodiode 11, and the bottom surface of each recess 28 is made into an opening 27a. Additionally, the surface of the recess 28 is covered by a light diffusion layer 29.

The light diffusion layer 29 is made of a mixture of BPSG (boro-phospho silicate glass), which is the material for an after-mentioned protective layer 30, and inorganic fine particles ($Al_2O_3$ or $TiO_2$) or organic fine particles (such as "polymer fine particle with plural holes on the surface" reported on a Web site [http://www.vbl.kobe-u.ac.jp/topics.html] searched on 23 Apr. 2005). With this composition, the light diffusion layer 29 has a property to diffuse (scatter) light. It is understood that the BPSG can be replaced with P-TEOS (plasma tetra ethyl ortho silicate) or the like.

The protective layer 30 and a planarizing layer 31 both provided on the light diffusion layer 29 are made of BPSG with different refractive indices. The interface between the protective layer 30 and the planarizing layer 31 expands downwardly above the photodiodes 11, and such shape makes the planarizing layer 31 function as an inner lens 31a. The light diffusion layer 29, the protective layer 30, and the planarizing layer 31 are made by a conventional film formation method such as CVD (chemical vapor deposition).

Provided on the planarizing layer 31 are color filters 32 that transmit the light of certain colors and microlenses 33. Each microlens 33 has an optical axis L approximately perpendicular to the light receiving surface of the photodiode 11. The optical axis of the inner lens 31a virtually coincides with the optical axis L of the microlens 33.

The incident light parallel to the optical axis L and substantially vertical to a light incident plane of the CCD image sensor 10 (hereinafter, vertical incident light) is condensed onto the photodiode 11 by an optical lens which is composed of the microlens 33 and the inner lens 31a. Besides, the light diffusion layer 29 is disposed outside the optical path of the vertical incident light which proceeds from the inner lens 31a to the photodiode 11, so that light receiving efficiency is not decreased.

Figure 3:
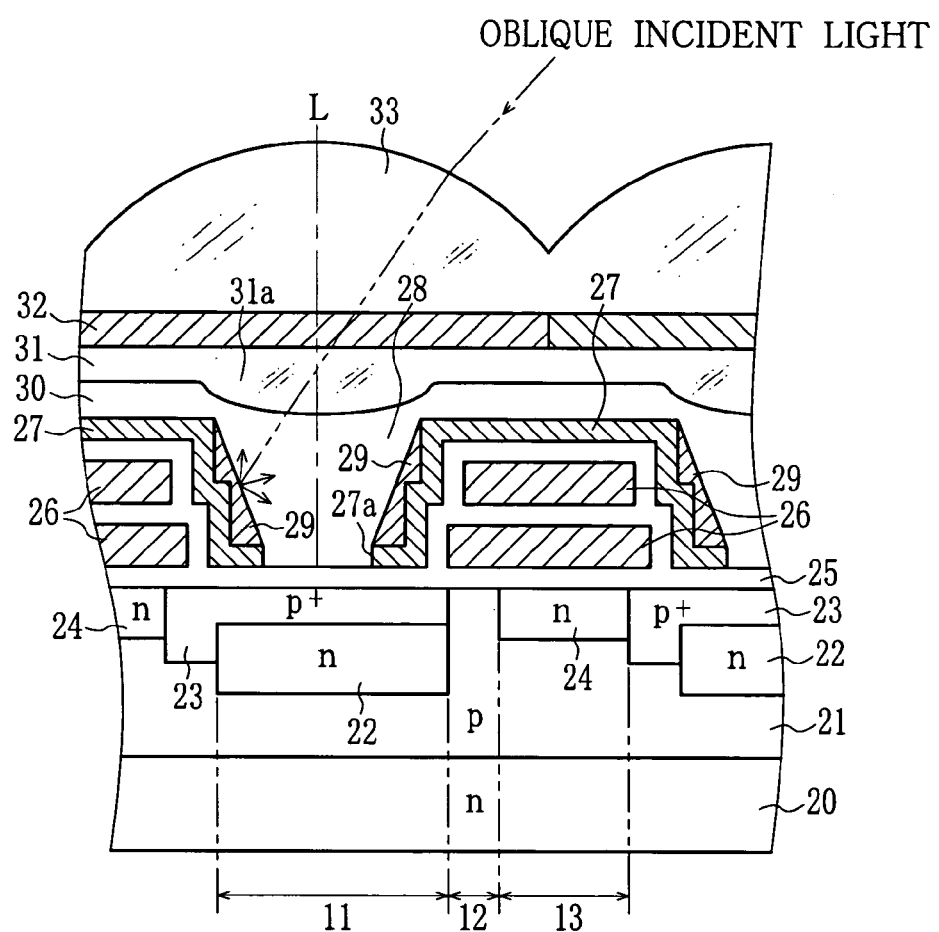
FIG. 3 is a cross sectional view showing an effect of a light diffusion layer.
Figure 5:
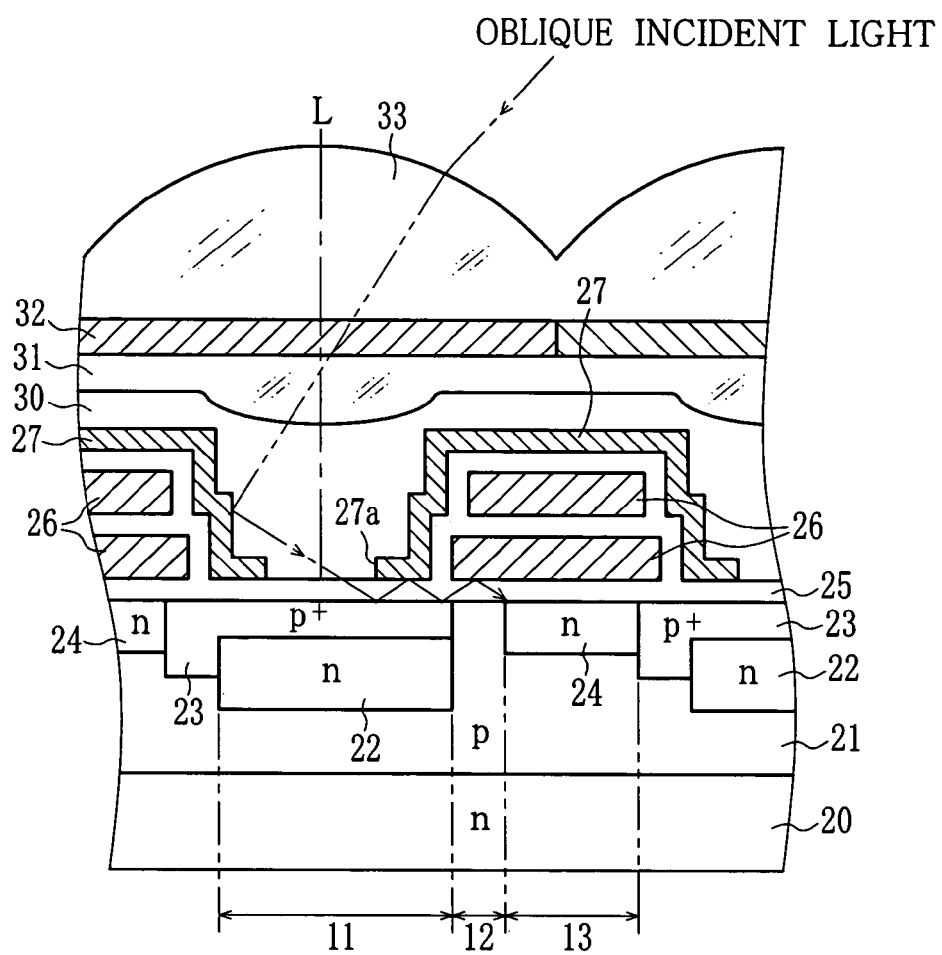
FIG. 5 is a cross sectional view of a conventional CCD image sensor.

In the CCD image sensor 10 with this configuration, the incident light oblique to the optical path L (hereinafter, oblique incident light), as shown in FIG. 3, passes through the microlens 33, the color filter 32, and the inner lens 31a to the light diffusion layer 29, on which the light is diffused finally. Therefore, the light that goes under the light shielding layer 27 to enter the vertical CCD 13 (see, FIG. 5) is decreased, and the smear is reduced consequently.

Figure 4:
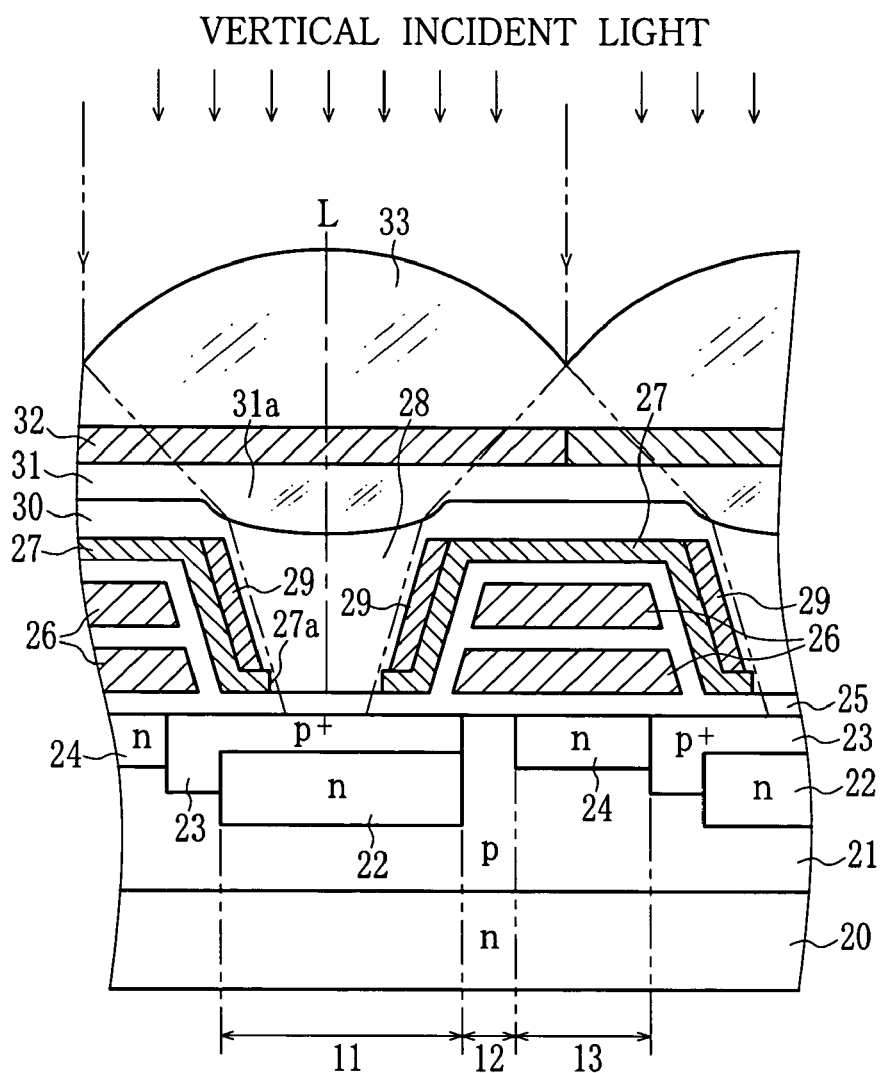
FIG. 4 is a cross sectional view of a CCD image sensor according to another embodiment of the present invention.

It is possible to change the shapes of the transfer electrodes 26 and the light shielding layer 27 to the extent that they stay out of the optical path of the vertical incident light. For example, as shown in FIG. 4, the side end faces of the transfer electrodes 26 and the side walls of each recess 28 of the light shielding layer 27 may be inclined along the optical path of the vertical incident light. Such shape can be formed by either an edge effect (edge erosion) of an usual etching or anisotropic etching. When shaped by the anisotropic etching, the upper and lower transfer electrodes 26 may be processed all at once or one level at a time. Since the light diffusion layer 29 has a flat surface that extends along the optical path of the vertical incident light as described above, light diffusion performance is not affected largely by an incident angle of light.

Also, it is possible to provide a light absorbing layer, instead of the light diffusion layer 29, on the surface of the recess 28. The light absorbing layer is made of BPSG or P-TEOS mixed with inorganic fine particles (ferric oxide, or barium sulfate with iron oxide coating) or organic fine particles (carbon fine particles or nano-carbon fine particles), and has a property to absorb light. With this configuration, the oblique incident light is directed to the light absorbing layer, where it is absorbed. Therefore, the light that goes under the light shielding layer 27 to enter the vertical CCD 13 is decreased, and the smear is reduced as a result.

It should be understood that the color filters 32 and the inner lens 31a may be omitted. Although the CCD image sensor 10 of the above embodiments is an interline transfer CCD, the present invention is not limited to this but rather applicable to frame transfer CCD image sensors and CMOS image sensors.

Various changes and modifications are possible in the present invention and may be understood to be within the present invention.

What is claimed is:

1. A solid state imaging device having a plurality of photodiodes for photoelectric conversion, comprising:
   a plurality of recesses each formed above one of said photodiodes;
   a light shielding layer covering over said recesses while uncovering an opening at a bottom of each of said recesses; and
   a light diffusion layer or light absorbing layer formed on said light shielding layer in each of said recesses while uncovering an opening at a bottom of each of said recesses, wherein said light diffusion layer and said light absorbing layer are made of a base material and inorganic fine particles or organic fine particles mixed thereto, and further wherein said inorganic fine particle for said light diffusion layer is $Al_2O_2$ or $TiO_2$.

2. A solid state imaging device described in claim 1, further comprising:
   transfer electrodes disposed beside said photodiodes and used for transferal of signal charge stored in said photodiodes, said transfer electrodes being formed on a semiconductor substrate having said photodiodes; and
   an insulating layer covering both said transfer electrodes and said photodiodes while defining said recesses, said light shielding layer being formed on said insulating layer.

3. A solid state imaging device described in claim 1, further comprising:
   optical lenses provided for each of said photodiodes,
   wherein said light diffusion layer or said light absorbing layer is disposed outside an optical path of incident light substantially parallel to an optical axis of said optical lens.

4. A solid state imaging device described in claim 1, wherein said base material is BPSG (boro-phospho silicate glass).

5. A solid state imaging device described in claim 1, wherein said base material is P-TEOS (plasma tetra ethyl ortho silicate).

6. A solid state imaging device having a plurality of photodiodes for photoelectric conversion, comprising:
   a plurality of recesses each formed above one of said photodiodes;
   a light shielding layer covering over said recesses while uncovering an opening at a bottom of each of said recesses; and a light diffusion layer or light absorbing layer formed on said light shielding layer in each of said recesses while uncovering an opening at a bottom of each of said recesses, wherein said light diffusion layer and said light absorbing layer are made of a base material and inorganic fine particles or organic fine particles mixed thereto, and further wherein said organic fine particle for said light diffusion layer is a polymer fine particle with plural holes on its surface.

7. A solid state imaging device having a plurality of photodiodes for photoelectric conversion, comprising:
   a plurality of recesses each formed above one of said photodiodes;
   a light shielding layer covering over said recesses while uncovering an opening at a bottom of each of said recesses; and
   a light diffusion layer or light absorbing layer formed on said light shielding layer in each of said recesses while uncovering an opening at a bottom of each of said recesses, wherein said light diffusion layer and said light absorbing layer are made of a base material and inorganic fine particles or organic fine particles mixed thereto, and further wherein said inorganic fine particle for said light absorbing layer is ferric oxide or a barium sulfate with iron oxide coating.

8. A solid state imaging device having a plurality of photodiodes for photoelectric conversion, comprising:
   a plurality of recesses each formed above one of said photodiodes;
   a light shielding layer covering over said recesses while uncovering an opening at a bottom of each of said recesses; and
   a light diffusion layer or light absorbing layer formed on said light shielding layer in each of said recesses while uncovering an opening at a bottom of each of said recesses, wherein said light diffusion layer and said light absorbing layer are made of a base material and inorganic fine particles or organic fine particles mixed thereto, and further wherein said organic fine particle for said light absorbing layer is a carbon fine particle or nano-carbon fine particle.

* * * * *